(12) United States Patent
Kim

(10) Patent No.: US 8,929,173 B1
(45) Date of Patent: Jan. 6, 2015

(54) DATA STROBE CONTROL DEVICE

(71) Applicant: SK Hynix Inc., Icheon-si Gyeonggi-do (KR)

(72) Inventor: Je Yoon Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/085,930

(22) Filed: Nov. 21, 2013

(30) Foreign Application Priority Data

Jun. 17, 2013 (KR) .................. 10-2013-0068829

(51) Int. Cl.
*G11C 7/22* (2006.01)
*G11C 8/18* (2006.01)

(52) U.S. Cl.
CPC ... *G11C 8/18* (2013.01); *G11C 7/22* (2013.01)
USPC .... 365/233.1; 365/193; 365/194; 365/233.18

(58) Field of Classification Search
CPC ............ G11C 8/18; G11C 7/22; G11C 7/222; G11C 7/1072
See application file for complete search history.

(56) References Cited

U.S. PATENT DOCUMENTS

| | | | |
|---|---|---|---|
| 6,091,663 A | 7/2000 | Kim et al. | |
| 6,850,458 B2 * | 2/2005 | Li | 365/233.12 |
| 7,606,089 B2 * | 10/2009 | Joo | 365/193 |
| 2005/0213396 A1 | 9/2005 | Aoki | |

FOREIGN PATENT DOCUMENTS

| | | |
|---|---|---|
| JP | 2005276396 A | 10/2005 |
| KR | 100257865 B1 | 3/2000 |

* cited by examiner

*Primary Examiner* — Tan T. Nguyen
(74) *Attorney, Agent, or Firm* — William Park & Associates Patent Ltd.

(57) ABSTRACT

A data strobe control device is disclosed, which relates to a technology for controlling a data write path of a semiconductor memory device. The data strobe control device includes: a plus-mode controller configured to output a first control signal for controlling a first mode and a plus on-the-fly signal upon receiving a plus-mode signal and an on-the-fly signal; an on-the-fly controller configured to output a second control signal for controlling a second mode according to the on-the-fly signal and an operation signal; a path controller configured to latch an address in response to the second control signal during the second mode, latch the address in response to the first control signal during the first mode, and accordingly output an address latch signal; and a strobe pulse generator configured to output a strobe control signal synchronized with a control clock signal in response to the address latch signal and a burst length signal.

13 Claims, 7 Drawing Sheets

DATA STROBE CONTROL DEVICE

CROSS-REFERENCE TO RELATED APPLICATION

This application claims priority under 35 U.S.C. 119(a) to Korean patent application No. 10-2013-0068829, filed on Jun. 17, 2013, in the Korean Intellectual Property Office, which is incorporated herein by reference in its entirety as set forth in full.

BACKGROUND OF THE INVENTION

1) Field of the Invention

Embodiments of the present invention relate to a data strobe control device, and more particularly to a technology for controlling a data write path of a semiconductor memory device.

2) Description of the Related Art

With the increasing degree of integration of semiconductor memory devices, semiconductor memory devices have been continuously improved to increase operation speed. In order to increase operation speed, synchronous memory devices capable of operating by synchronizing with an external clock of a memory chip have recently been proposed and developed.

A representative example of a synchronous memory device is a single data rate (SDR) synchronous memory device that is synchronized with a rising edge of an external clock of a memory device such that one data piece can be input and/or output during one clock period at one data pin.

However, the SDR synchronous memory device also has difficulty in satisfying high-speed operations of a system. Thus, a double data rate (DDR) synchronous memory device capable of processing two data pieces during one clock period has been proposed.

Two contiguous data pieces are input and output through respective data input/output (I/O) pins of a DDR synchronous memory device, such that the two contiguous data pieces are synchronized with a rising edge and a falling edge of an external input clock. Therefore, although the clock frequency of a DDR synchronous memory device is not increased, the DDR synchronous memory device may have a bandwidth that is at least two times larger than that of an SDR synchronous memory device, such that a DDR synchronous memory device can operate at a higher speed than an SDR synchronous memory device.

The DDR synchronous memory device is configured to use a multi-bit prefetching scheme capable of simultaneously processing multiple bits (multi-bit). The multi-bit prefetch scheme synchronizes sequential input data pieces with a data strobe signal such that the input data pieces can be arranged in parallel to one another. Thereafter, a multi-bit prefetch scheme can simultaneously store the arranged multi-bit data pieces upon receiving a write command synchronized with an external clock signal.

Meanwhile, an operation mode for supporting a 2-clock base operation between different bank groups is referred to as a plus mode. If a DDR synchronous memory device enters the plus mode, the DDR synchronous memory device performs a normal 4-clock write/read operation on the basis of DDR3, and then performs a 2-clock write/read operation.

Specifically, the plus mode is also applied to an on-the-fly mode. The on-the-fly mode is a specific mode in which a burst length BL4 or a burst length BL8 is carried out based on an address. As can be seen from the JEDEC specification, a bank is largely divided into two bank parts in a manner that all cells contained in a memory bank can be utilized either in the burst length BL4 or in the on-the-fly mode operation, such that a selection operation for determining whether data will be written at the left or right side is achieved.

In this case, during a normal on-the-fly mode, a 4-clock base operation is achieved so that an address variation occurs in the range of 4 clocks. However, a clock base operation is needed for the plus on-the-fly mode, such that a normal operation must be performed by an on-the-fly-associated address toggle action. In the case of a manufactured product configured to operate at a low power-supply voltage, a defective margin frequently occurs between an address and an operation command.

BRIEF SUMMARY OF THE INVENTION

Various embodiments of the present invention are directed to providing a data strobe control device that substantially obviates one or more problems due to limitations and disadvantages of the related art.

An embodiment of the present invention relates to a data strobe control device configured to prevent a faulty operation of a plus mode from occurring in a low power-supply voltage environment.

In accordance with an embodiment of the present invention, a data strobe control device includes: a plus-mode controller configured to output a first control signal for controlling a first mode and a plus on-the-fly signal upon receiving a plus-mode signal and an on-the-fly signal; an on-the-fly controller configured to output a second control signal for controlling a second mode according to the on-the-fly signal and an operation signal; a path controller configured to latch an address in response to the second control signal during the second mode, latch the address in response to the first control signal during the first mode, and accordingly output an address latch signal; and a strobe pulse generator configured to output a strobe control signal synchronized with a control clock signal in response to the address latch signal and a burst length signal.

It is to be understood that both the foregoing general description and the following detailed description of the present invention are an example and explanatory and are intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
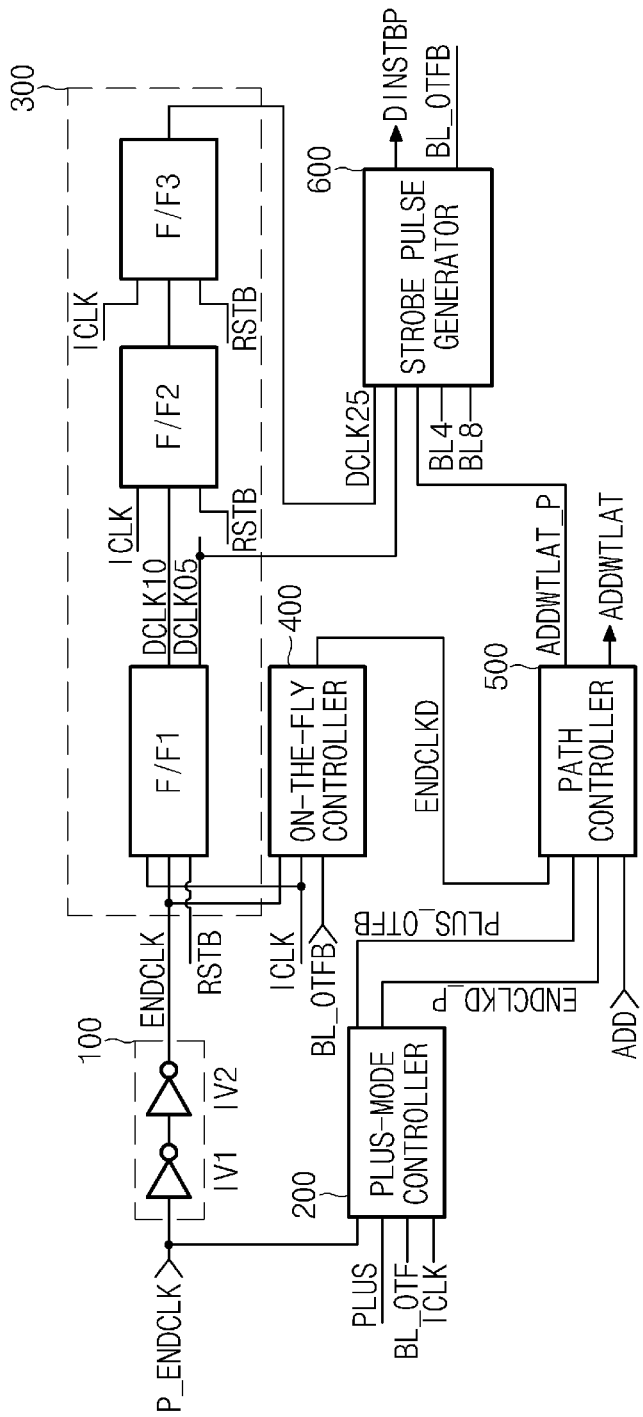
FIG. 1 is a block diagram illustrating a data strobe control device according to an embodiment.

FIG. 1 is a block diagram illustrating a data strobe control device according to an embodiment.

Referring to FIG. 1, the data strobe control device according to one embodiment includes a delay unit 100, a plus-mode controller 200, a storage unit 300, an on-the-fly controller 400, a path controller 500, and a strobe pulse generator 600.

The delay unit 100 delays a pre-clock signal (P_ENDCLK) for a predetermined time, and outputs an operation signal (ENDCLK). The delay unit 100 includes a plurality of inverters (IV1, IV2) configured to perform non-inverting of the pre-clock signal (P_ENDCLK). Although the above embodiment assumes that the number of inverters contained in the delay unit 100 is set to 2 (i.e., IV1, IV2) for convenience of description, the scope or spirit of the present invention is not limited thereto. Accordingly, in other embodiments, the number of inverters comprising the delay unit 100 may be greater or less than two.

Only when the plus-mode controller 200 is in the plus on-the-fly mode according to at least one of the pre-clock signal (P_ENDCLK), the plus-mode signal (PLUS), the on-the-fly signal (BL_OTF), and the internal clock signal (ICLK), the plus-mode controller 200 may receive the pre-clock signal (P_ENDCLK) corresponding to a write command, and may output a control signal (ENDCLKD_P) and a plus on-the-fly signal (PLUS_OTFB).

The storage unit 300 may synchronize an operation signal (ENDCLK) with the internal clock signal (ICLK), and may store the synchronized result. The storage unit 300 may include a plurality of flip-flops (F/F1~F/F3). The flip-flops (F/F1~F/F3) may be reset in response to a reset signal (RSTB).

In one example, the flip-flop (F/F1) may synchronize the operation signal (ENDCLK) to the internal clock signal (ICLK), may store the synchronized result, and may output control clock signals (DCLK05, DCLK10). The flip-flop (F/F2) may synchronize the control clock signal (DCLK10) to the internal clock signal (ICLK), and may store the synchronized result. In addition, the flip-flop (F/F3) may synchronize the output clock of the flip-flop (F/F2) to the internal clock signal (ICLK), store the synchronized result, and output a control clock signal (DCLK25).

The on-the-fly controller 400 controls the on-the-fly operation according to at least one of the on-the-fly signal (BL_OTFB), the internal clock signal (ICLK), and the operation signal (ENDCLK), such that the on-the-fly controller 400 outputs a control signal (ENDCLKD). The on-the-fly signal (BL_OTFB) is an inverting signal of the on-the-fly signal (BL_OTF).

The path controller 500 outputs an address latch signal (ADDWTLAT) or another address latch signal (ADDWTLAT_P) so as to select a normal on-the-fly path or a plus on-the-fly path in response to at least one of the control signal (ENDCLKD), the plus on-the-fly signal (PLUS_OTFB), the control signal (ENDCLKD_P), and the address (ADD).

The strobe pulse generator 600 controls a strobe pulse in response to at least one of the control clock signal (DCLK25), the other control clock signal (DCLK05), the address latch signal (ADDWTLAT_P), the burst length signal (BL4), and the burst length signal (BL8), such that the strobe pulse generator 600 outputs an on-the-fly signal (BL_OTFB) and a strobe control signal (DINSTBP).

The data strobe control device according to an embodiment is configured to receive not only data of a first burst length predetermined for the data write operation, but also data of a second burst length identical to a half of the first burst length. In this case, data of the first burst length may indicate data input associated with the burst length signal (BL8), and data of the second burst length may indicate data input associate with the burst length signal (BL4).

Figure 2:
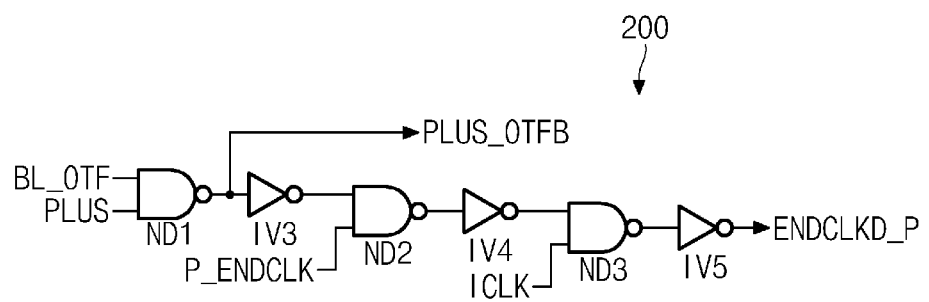
FIG. 2 is a detailed circuit diagram illustrating a plus-mode controller shown in FIG. 1.

FIG. 2 is a detailed circuit diagram illustrating the plus-mode controller 200 shown in FIG. 1.

The plus-mode controller 200 includes a plurality of NAND gates (ND1~ND3) and a plurality of inverters (IV3~IV5).

The NAND gate ND1 performs a NAND operation between the on-the-fly signal (BL_OTF) and the plus-mode signal (PLUS), such that NAND gate ND1 outputs the plus on-the-fly signal (PLUS_OTFB). The NAND gate ND2 performs a NAND operation between the pre-clock signal (P_ENDCLK) and the plus on-the-fly signal (PLUS_OTFB) inverted by the inverter IV3. In addition, the NAND gate ND3 performs a NAND operation between the internal clock signal (ICLK) and the output signal of the NAND gate (ND2) inverted by the inverter IV4. The inverter IV5 outputs the output signal of the NAND gate ND3, such that the inverter IV5 outputs the control signal (ENDCLKD_P).

Figure 3:
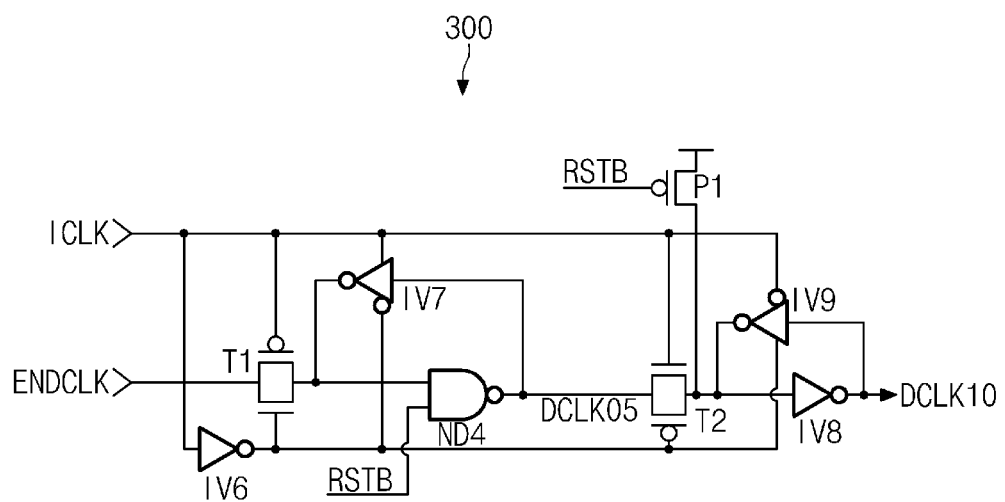
FIG. 3 is a detailed circuit diagram illustrating a storage unit shown in FIG. 1.

FIG. 3 is a detailed circuit diagram illustrating the storage unit 300 shown in FIG. 1.

Referring to FIG. 3, the storage unit 300 includes a plurality of transfer gates (T1, T2), a NAND gate (ND4), a plurality of inverters (IV6~IV9), and a PMOS transistor P1.

In an embodiment, the transfer gate T1 may selectively output the operation signal (ENDCLK) according to the internal clock signal (ICLK) and another internal clock signal (ICLK) inverted by the inverter IV6. The transfer gate T1 may receive the internal clock signal (ICLK) through a gate terminal of a PMOS transistor, and may receive another internal clock signal (ICLK) inverted by the inverter IV6 through a gate terminal of an NMOS transistor.

The NAND gate ND4 performs a NAND operation between a reset signal (RSTB) and an output signal of the transfer gate T1, and outputs a control clock signal (DCLK05). The inverter IV7 may correspond to a 3-state inverter, and may selectively latch the control clock signal (DCLK05) in response to the output signal of the inverter IV6.

In addition, the transfer gate T2 may selectively output the control clock signal (DCLK05) in response to the internal clock signal (ICLK) and another internal clock signal (ICLK) inverted by the inverter IV6. The transfer gate T2 may receive the internal clock signal (ICLK) through a gate terminal of the NMOS transistor, and may receive another internal clock signal (ICLK) inverted by the inverter IV6 through a gate terminal of the PMOS transistor.

The inverters (IV8, IV9) may latch an output signal of the transfer gate T2, such that the inverter IV8 may selectively output the control clock signal (DCLK10). In this case, the inverter IV9 may correspond to a 3-state inverter, and may selectively latch the output signal of the transfer gate T2 in response to the internal clock signal (ICLK).

Figure 4:
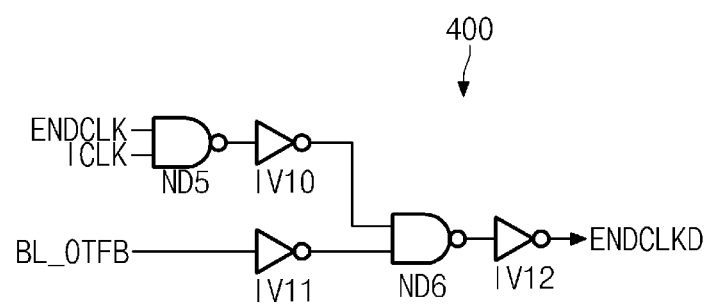
FIG. 4 is a detailed circuit diagram illustrating an on-the-fly controller shown in FIG. 1.

FIG. 4 is a detailed circuit diagram illustrating the on-the-fly controller 400 shown in FIG. 1.

Referring to FIG. 4, the on-the-fly controller 400 includes a plurality of NAND gates (ND5, ND6) and a plurality of inverters (IV10~IV12).

The NAND gate ND5 performs a NAND operation between the operation signal (ENDCLK) and the internal clock (ICLK). The NAND gate ND6 performs a NAND operation between the on-the-fly signal (BL_OTFB) inverted by the inverter IV11 and the NAND-gate (ND5) output signal inverted by the inverter IV10. In addition, the inverter IV12 inverts the output signal of the NAND gate ND6, such that the inverter IV12 outputs the control signal (ENDCLKD).

Figure 5:
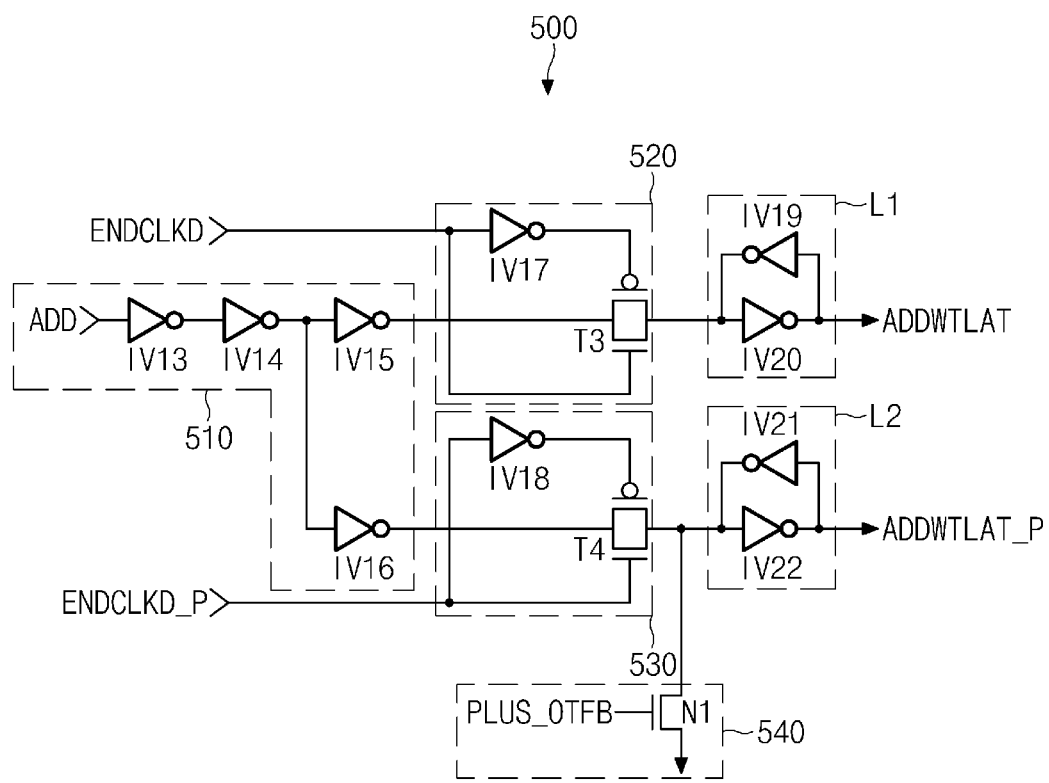
FIG. 5 is a detailed circuit diagram illustrating a path controller shown in FIG. 1.

FIG. 5 is a detailed circuit diagram illustrating the path controller 500 shown in FIG. 1.

Referring to FIG. 5, the path controller 500 includes an address delay unit 510, selection units 520, 530 latch units (L1, L2), and an initialization unit 540. In this embodiment, the address delay unit 510 includes a plurality of inverters (IV13~IV16), and the selection units 520, 530 include transfer gates (T3, T4) and inverters (IV17, IV18). In addition, the latch unit L1 includes latch-shaped inverters (IV19, IV20). The latch L2 includes latch-shaped inverters (IV21, IV22). In addition, the initialization unit 540 includes an NMOS transistor N1.

The plurality of inverters (IV13~IV15) may invert and delay the address (ADD). The inverter IV16 may invert and delay the output signal of the inverter IV14.

The transfer gate T3 may selectively output the output signal of the inverter IV15 in response to the control signal (ENDCLKD) and control signal (ENDCLKD) inverted by the inverter IV17. In this case, the transfer gate T3 may receive the control signal (ENDCLKD) inverted by the inverter IV17 through a gate terminal of a PMOS transistor, and the transfer gate T3 may receive control signal (ENDCLKD) through a gate terminal of an NMOS transistor. Thus, in one embodiment, the first selection unit 520 may be configured to output the address (ADD) when the control signal (ENDCLKD) is activated.

The transfer gate T4 may selectively output the output signal of the inverter IV16 in response to a control signal (ENDCLKD_P) and another control signal (ENDCLKD_P) inverted by the inverter IV18. In this example, the transfer gate T4 may receive a control signal (ENDCLKD_P) inverted by the inverter IV18 through a gate terminal of a PMOS transistor, and the transfer gate T4 may receive another control signal (ENDCLKD_P) through a gate terminal of an NMOS transistor. Thus, in one embodiment, the second selection unit 530 may be configured to output the address (ADD) when the control signal (ENDCLKD_P) is activated.

The latch unit L1 includes a plurality of inverters (IV19, IV20). In the latch unit L1, an output terminal of one inverter IV19 is coupled to an input terminal of the other inverter IV20, and an output terminal of the inverter IV20 is coupled to an input terminal of the inverter IV19. The latch L1 may latch the output signal of the transfer gate T3 for a predetermined time, and output an address latch signal (ADDWTLAT).

In this example, the address latch signal (ADDWTLAT) is an address (ADD) control signal for selecting any one of the burst length signal (BL4) or the burst length signal (BL8) according to a state of the control signal (ENDCLKD).

The latch unit L2 includes a plurality of inverters (IV21, IV22). In the latch unit L2, an output terminal of one inverter IV21 is coupled to an input terminal of the other inverter IV22, and an output terminal of the inverter IV22 is coupled to an input terminal of the inverter IV21. The latch L2 may latch the output signal of the transfer gate T4 for a predetermined time, and output an address latch signal (ADDWTLAT_P).

The NMOS transistor N1 of the initialization unit 540 is coupled between the output terminal of the transfer gate T4 and a ground voltage terminal. The NMOS transistor N1 may receive the plus on-the-fly signal (PLUS_OTFB) through a gate terminal.

Although the above-mentioned embodiment has disclosed an example where the initialization unit 540 includes an NMOS transistor for convenience of description, the scope or spirit of the present invention is not limited thereto, the above-mentioned embodiment may also be implemented including a PMOS transistor as necessary so that the PMOS transistor can be controlled by an opposite phase of the plus on-the-fly signal (PLUS_OTFB).

Figure 6:
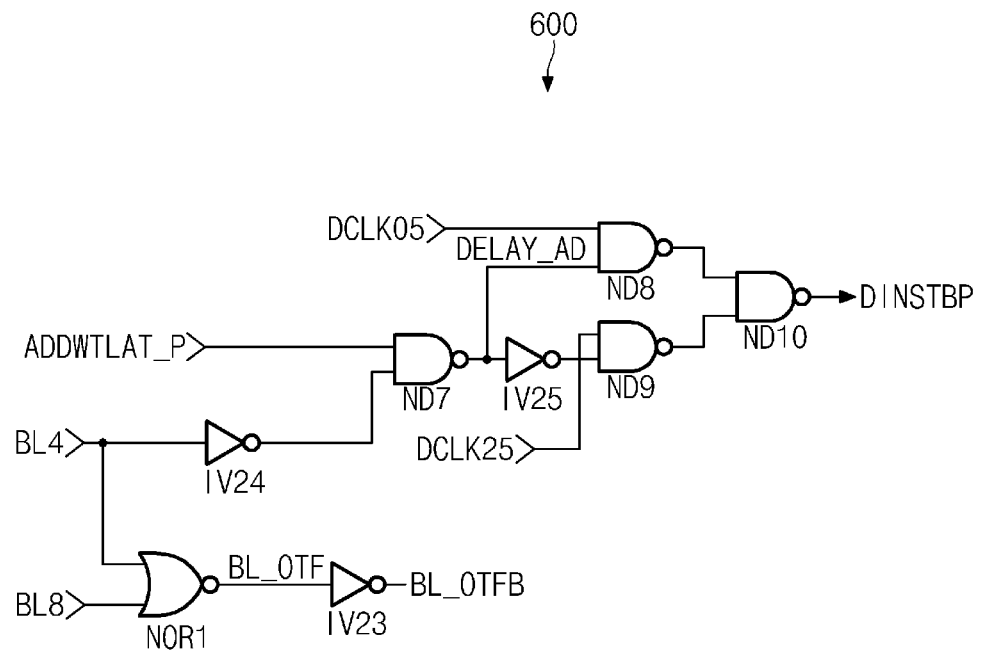
FIG. 6 is a detailed circuit diagram illustrating a strobe pulse generator shown in FIG. 1.

FIG. 6 is a detailed circuit diagram illustrating the strobe pulse generator 600 shown in FIG. 1.

Referring to FIG. 6, the strobe pulse generator 600 includes a NOR gate NOR1, a plurality of NAND gates (ND7~ND10), and a plurality of inverters (IV23~IV25).

In this example, the NOR gate NOR1 performs a NOR operation between one burst length signal (BL4) and another burst length signal (BL8). The inverter IV23 may invert the output signal of the NOR gate NOR1, such that the inverter IV23 outputs the on-the-fly signal (BL_OTFB).

The NAND gate ND7 performs a NAND operation between the address latch signal (ADDWTLAT_P) and the burst length signal (BL4) inverted by the inverter IV24, such that the NAND gate ND7 outputs a delay signal (DELAY_AD). In addition, the NAND gate ND8 performs a NAND operation between the control clock signal (DCLK05) and the delay signal (DELAY_AD). The NAND gate ND9 performs a NAND operation between the control clock signal (DCLK25) and the delay signal (DELAY_AD) inverted by the inverter IV25. The NAND gate ND10 performs a NAND operation between the output signals of the NAND gates (ND8, ND9), such that the NAND gate ND10 outputs a strobe control signal (DINSTBP). Thus, in one embodiment, the strobe pulse generator 600 combines the address latch signal (ADDWTLAT_P), burst length signal (BL4), the burst length signal (BL8), and outputs the strobe control signal (DINSTBP) synchronized with the control clock signal (DCLK05) or the control clock signal (DCLK25).

The data strobe control device according to the above-mentioned embodiments will hereinafter be described with reference to the attached drawings.

The delay unit 100 performs non-inverting and delaying of the pre-clock signal (P_ENDCLK) for a predetermined time, such that the delay unit 100 outputs the operation signal (ENDCLK). The flip-flop (F/F1) synchronizes the operation signal (ENDCLK) to the internal clock signal (ICLK), such that the flip-flop (F/F1) outputs the control clock signal (DCLK05) to the strobe pulse generator 600. The flip-flop (F/F2) synchronizes the control clock signal (DCLK10) received from the flip-flop (F/F1) to the internal clock signal (ICLK), and the flip-flop (F/F2) outputs the synchronized result. The flip-flop F/F3 synchronizes the output signal of the flip-flop (F/F2) to the internal clock signal (ICLK), such that the flip-flop (F/F3) outputs the control clock signal (DLCK25) to the strobe pulse generator 600.

In an embodiment, the operation signal (ENDCLK) may correspond to the write operation command signal. However, the scope or spirit of the present invention is not limited thereto, and the data strobe control device of some embodiments may operate in response to a read operation command signal, or other type of command signal. Therefore, the storage unit 300 may generate a write operation command signal delayed for each clock, and output the delayed write operation command signal to the strobe pulse generator 600. That is, the storage unit 300 may generate control clock signals (DCLK05, DCLK25) suitable for the size of data for each burst length.

In addition, the on-the-fly controller 400 may synchronize the operation signal (ENDCLK) with the internal clock signal (ICLK). During the on-the-fly mode, the on-the-fly controller 400 may activate and output the control signal (ENDCLKD) in response to the on-the-fly signal (BL_OTFB), activated at a low level, and in response to the internal clock signal (ICLK). That is, assuming that the on-the-fly signal (BL_OTFB) is at a low level and the operation signal (ENDCLK) is at a high level during the on-the-fly mode, the control signal (ENDCLKD) is activated to a high level. Thus, in one embodiment, the on-the-fly controller 400 may be configured to output the control signal (ENDCLKD) for controlling the on-the-fly mode according to the on-the-fly signal (BL_OTFB) and the operation signal (ENDCLK).

If the control signal (ENDCLKD) is activated to a high level, the path controller 500 latches an address (ADD) in response to the control signal (ENDCLKD) during the on-the-fly mode, selects a normal on-the-fly path, and outputs an address latch signal (ADDWTLAT).

Further, the plus-mode controller 200 controls a plus on-the-fly mode when the plus-mode signal (PLUS) and the on-the-fly signal (BL_OTF) are activated, such that the plus-mode controller 200 outputs the plus on-the-fly signal (PLUS_OTFB) of a low level. The plus-mode controller 200 synchronizes the inverted plus on-the-fly signal (PLUS_OTFB) with the pre-clock signal (P_ENDCLK), and outputs the synchronized result. If the internal clock signal (ICLK) is activated, the control signal (ENDCLKD_P) is activated to a high level so that the plus-mode controller 200 outputs the control signal (ENDCLKD_P) with a high level. That is, the plus-mode controller 200 receives the pre-clock signal (P_ENDCLK) indicating a write command during the plus on-the-fly mode only, such that the plus-mode controller 200 outputs the control signal (ENDCLKD_P) synchronized with the internal clock signal (ICLK). In other words, the plus-mode controller 200 may be configured to activate and output control signal (ENDCLKD_P) and the plus on-the-fly signal (PLUS_OTFB) only during the plus on-the-fly mode according to a combination of the pre-clock signal (P_ENDCLK) indicating a write command, the plus-mode signal (PLUS), on-the-fly signal (BL_OTF), and the internal clock signal (ICLK). Thus, in some embodiments, the plus-mode controller 200 may be configured to output the control signal (ENDCLKD_P) for controlling the plus on-the-fly mode and the plus on-the-fly signal (PLUS_OTFB) upon receiving the plus-mode signal (PLUS) and the on-the-fly signal (PLUS_OTFB).

Thereafter, if the plus on-the-fly signal (PLUS_OTFB) is at a low level during the plus on-the-fly mode, the NMOS transistor N1 of the path controller 500 is turned off. In addition, if the control signal (ENDCLKD_P) is at a high level, the transfer gate T4 of the path controller 500 is turned on, such that the path controller 500 outputs the latched address latch signal (ADDWTLAT_P). In one embodiment, the path controller 500 may be configured to latch the address (ADD) in response to the control signal (ENDCLKD_P) during the plus on-the-fly mode and output the address latch signal (ADDWTLAT_P).

On the other hand, if the control signal (ENDCLKD) is at a high level during the normal on-the-fly mode, the transfer gate T3 of the path controller 500 is turned on, such that the path controller 500 outputs the latched address latch signal (ADDWTLAT).

Assuming that at least one of the plus-mode signal (PLUS) and the on-the-fly signal (BL_OTF) is at a low level, the plus on-the-fly signal (PLUS_OTFB) is at a high level. Therefore, the NMOS transistor N1 is turned on, such that the input signal of the latch unit L2 is pulled down to a low level. Therefore, the latched state of the address latch signal (ADDWTLAT_P) can be maintained.

That is, assuming that at least one of the burst length signal (BL4) and the burst length signal (BL8) is activated to a high level during the normal on-the-fly operation mode, the strobe pulse generator 600 outputs the on-the-fly signal (BL_OTFB) of a high level. As a result, the on-the-fly controller 400 determines a normal on-the-fly operation mode, such that the on-the-fly controller 400 outputs the control signal (ENDCLKD) of a low level.

Therefore, the transfer gate T3 of the path controller 500 is turned off and the latched state of the address latch signal (ADDWTLAT) is maintained. The NMOS transistor N1 of the path controller 500 is turned on, such that a high-level latched state of the address latch signal (ADDWTLAT_P) is maintained.

That is, assuming that the NMOS transistor N1 is pulled down, a signal line of the address latch signal (ADDWTLAT_P) is initialized. In the case of an initialization operation, the on-the-fly mode is at a low level corresponding to a default state before entering the on-the-fly mode by a mode register set (MRS), such that the on-the-fly mode is reset to the burst length signal (BL8).

Accordingly, a margin between the delayed address latch signal (ADDTLAT) for deciding the burst length signals (BL4, BL8) and the control clock signal (DCLK05) is reduced due to a difference in the number of gate stages during the plus on-the-fly mode. Specifically, as a voltage of the semiconductor memory device is gradually reduced and a frequency of the semiconductor device is gradually increased, a margin is rapidly reduced in proportion to the reduced voltage and the increased frequency.

Therefore, the data strobe control device according to an embodiment reduces the number of gate stages, and separates a path of the normal on-the-fly mode and a path of the plus on-the-fly mode from each other in the same manner as in the path controller 500, such that the data strobe control device can improve a margin point encountered in a low-voltage and high-frequency state.

In addition, assuming that the address latch signal (ADDWTLAT_P) is at a high level, the strobe pulse generator 600 may change a level of the delay signal (DELAY_AD) in response to a state of the burst length signal (BL4). In other words, if the burst length signal BL4 is at a low level, the strobe pulse generator 600 outputs a strobe control signal (DINSTBP) of a high level if the control clock signal (DCLK05) is at a high level. If the burst length signal BL4 is at a high level, the strobe pulse generator 500 outputs the strobe control signal (DINSTBP) of a high level if the control clock signal (DCLK25) is at a high level.

In this case, assuming that the strobe control signal (DINSTBP) is synchronized with the internal clock signal (ICLK) and corresponds to the burst length signal (BL4), a write strobe pulse corresponding to 2 clocks is generated. Therefore, write data suitable for the burst length can be accessed to a cell. If the strobe control signal (DINSTBP) corresponds to the burst length signal (BL8), the strobe pulse generator 600 generates a write strobe pulse corresponding to 4 clocks such that the strobe pulse generator 600 can access write data. In other words, in one embodiment, the strobe plus generator 600 may be configured to output the strobe control signal (DINSTBP) synchronized with the control clock signal (ICLK) in response to the address latch signal (ADDWT-LAT_P) and a burst length signal (BL4 or BL8).

That is, during the plus on-the-fly mode, the address latch signal (ADDWTLAT_P) synchronized with the pre-clock signal (P_ENDCLK) and the internal clock signal (ICLK) is generated. The path controller 500 may generate the strobe control signal (DINSTBP) in response to the address latch signal (ADDWTLAT_P). The strobe pulse generator 600 rapidly receives the address (ADD) in response to the address latch signal (ADDWTLAT_P), and improves a margin between the control clock signal (DCLK05) and the delay signal (DELAY_AD), such that the strobe pulse generator 600 can improve the write operation speed in a low-voltage or high-speed mode.

Figure 7:
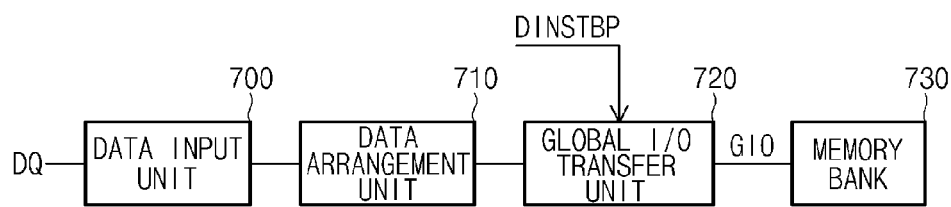
FIG. 7 is a block diagram illustrating peripheral parts of a device configured to receive a strobe control signal of FIG. 6 as an input signal.

FIG. 7 is a block diagram illustrating peripheral parts of a device configured to receive the strobe control signal (DINSTBP) of FIG. 6 as an input signal.

A control region of the semiconductor memory device may be divided into a core region for processing data and an input/output (I/O) region for data communication with an external semiconductor device. The data I/O region includes a data block for buffering data received from an external part and transmitting the buffered data to the core region.

The data I/O region includes a data input unit 700, a data arrangement unit 710, and a global I/O transfer unit 720. The data input unit 700 receives write data DQ indicating the write operation. In this case, the write data DQ may be data having a predetermined first burst length, or may be data having a second burst length corresponding to half the first burst length.

For example, when the burst length (BL) of the write operation is established by the mode register set (MRS) in DDR3 SDRAM, the burst length (BL) operation may be classified into three operations, i.e., a BL4 (Burst 4 mode) operation, a BL8 (Burst 8 mode) operation, an OTF (On-The-Fly) operation mode. In the case of the BL8 operation, the burst length (BL) of input data for the write operation is composed of 8 bits. In the case of the BL4 operation, or in the case of the OTF mode, the burst length (BL) of input data for the write operation is composed of 4 bits.

That is, when in the OTF mode, the burst length (BL) is not determined to be 4 or 8, instead the burst length (BL) is determined according to whether an address value is set to one or zero. The address value may be obtained when the read or write command is input.

The data arrangement unit 710 may arrange input data of the data input unit 700, such that the data arrangement unit 710 outputs data having a first burst length. For example, in the case of DDR3 SDRAM, the data arrangement unit 710 receives rising data and falling data from the data input unit 700, arranges the received rising and falling data on the basis of the falling edge of the strobe control signal (DINSTBP) and the rising edge of the external clock signal, and outputs the arranged result.

The data strobe control device according to an embodiment applies the strobe control signal (DINSTBP) to the global I/O transfer unit 720. The global I/O transfer unit 720 may receive the first-burst-length data arranged by the data arrangement unit 710, and may selectively load the first-burst-length data or the second-burst-length data to a global bus GIO. That is, the global I/O transfer unit 720 is synchronized with an activation time point of the strobe control signal (DINSTBP), and transmits data to a global bus (GIO). In one example, the global I/O transmission unit 720 may include a multiplexer, an I/O sense-amplifier (sense-amp), etc.

The global I/O transfer unit 720 is coupled to a memory bank 730 through the global bus (GIO). The memory bank 730 writes the corresponding burst length data loaded on the global bus (GIO) in the cell.

As is apparent from the above description, the data strobe control device according to embodiments can prevent a faulty operation of a plug mode from occurring in a low power-supply voltage environment.

Those skilled in the art will appreciate that the present invention may be carried out in other specific ways than those set forth herein without departing from the spirit and essential characteristics of the present invention. The above example embodiments are therefore to be construed in all aspects as illustrative and not restrictive. The scope of the invention should be determined by the appended claims and their legal equivalents, not by the above description, and all changes coming within the meaning and equivalent range of the appended claims are intended to be embraced therein. Also, it is obvious to those skilled in the art that claims that are not explicitly cited in each other in the appended claims may be presented in combination as an example embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A data strobe control device comprising:
    a plus-mode controller configured to output a first control signal for controlling a first mode and a plus on-the-fly signal upon receiving a plus-mode signal and an on-the-fly signal;
    an on-the-fly controller configured to output a second control signal for controlling a second mode according to the on-the-fly signal and an operation signal;
    a path controller configured to latch an address in response to the second control signal during the second mode, latch the address in response to the first control signal during the first mode, and accordingly output an address latch signal; and
    a strobe pulse generator configured to output a strobe control signal synchronized with a control clock signal in response to the address latch signal and a burst length signal.

2. The data strobe control device according to claim 1, further comprising:
    a delay unit configured to delay a pre-clock signal for a predetermined time, and accordingly output the operation signal.

3. The data strobe control device according to claim 1, further comprising:
    a storage unit configured to synchronize the operation signal with an internal clock signal, and accordingly generate the control clock signal.

4. The data strobe control device according to claim 1, wherein the plus-mode controller is configured to activate and output the first control signal and the plus on-the-fly signal only during the first mode according to a combination of a pre-clock signal indicating a write command, the plus-mode signal, the on-the-fly signal, and an internal clock signal.

5. The data strobe control device according to claim 1, wherein the on-the-fly controller is configured to activate and output the second control signal during the second mode according to the on-the-fly signal, an internal clock signal, and the operation signal.

6. The data strobe control device according to claim 1, wherein the path controller includes:
   an address delay unit configured to delay the address for a predetermined time;
   a selection unit configured to selectively output the address according to activation states of the first control signal and the second address; and
   a latch unit configured to latch an output signal of the selection unit, and output the address latch signal.

7. The data strobe control device according to claim 6, wherein the selection unit includes:
   a first selection unit configured to output the address when the first control signal is activated; and
   a second selection unit configured to output the address when he second control signal is activated.

8. The data strobe control device according to claim 7, wherein the latch unit includes:
   a first latch configured to latch an output signal of the first selection unit; and
   a second latch configured to latch an output signal of the second selection unit.

9. The data strobe control device according to claim 7, wherein the path controller includes:
   an initialization unit configured to initialize an output line of the first selection unit in response to the plus on-the-fly signal.

10. The data strobe control device according to claim 1, wherein the strobe pulse generator combines the address latch signal, a first burst length signal, a second burst length signal, and outputs the strobe control signal synchronized with the first control clock signal or the second control clock signal.

11. The data strobe control device according to claim 10, wherein the first burst length signal has data of a burst length corresponding to a half of the second burst length signal.

12. The data strobe control device according to claim 1, wherein the first mode is a plus on-the-fly mode.

13. The data strobe control device according to claim 1, wherein the second mode is an on-the-fly mode.

* * * * *